United States Patent
Ding et al.

(10) Patent No.: US 12,204,992 B2
(45) Date of Patent: Jan. 21, 2025

(54) IMPLEMENTING QUBIT GATES USING PHASE-SHIFTED MICROWAVE PULSES

(71) Applicant: Alibaba Innovation Private Limited, Singapore (SG)

(72) Inventors: Dawei Ding, San Diego, CA (US); Jianxin Chen, Kirkland, WA (US); Jiachen Huang, San Mateo, CA (US)

(73) Assignee: Alibaba Innovation Private Limited, Singapore (SG)

( * ) Notice: Subject to any disclaimer, the term of this patent is extended or adjusted under 35 U.S.C. 154(b) by 834 days.

(21) Appl. No.: 17/244,930

(22) Filed: Apr. 29, 2021

(65) Prior Publication Data
US 2023/0141379 A1    May 11, 2023

(51) Int. Cl.
*G06N 10/20* (2022.01)
*G06N 10/40* (2022.01)
*H03K 19/195* (2006.01)

(52) U.S. Cl.
CPC ............ *G06N 10/20* (2022.01); *G06N 10/40* (2022.01); *H03K 19/195* (2013.01)

(58) Field of Classification Search
None
See application file for complete search history.

(56) References Cited

U.S. PATENT DOCUMENTS

2020/0311590 A1 * 10/2020 Chen .................... G06N 10/00
2022/0188182 A1 *  6/2022 Capelluto ............. G06F 11/076

FOREIGN PATENT DOCUMENTS

| CN | 111770565 A | 10/2020 |
|---|---|---|
| CN | 111800851 A | 10/2020 |
| CN | 111867041 A | 10/2020 |

OTHER PUBLICATIONS

PCT International Search Report and Written Opinion mailed Jan. 4, 2022, issued in corresponding International Application No. PCT/CN2021/085052 (12 pgs.).
CATT, "Timing Relationship discussion for NTN," 3GPP TSG RAN WG1 #103-e, 4 pages, 2020.
Huawei, "Discussion on timing relationship enhancements for NTN," 3GPP TSG RAN WG1 Meeting #103-e, 6 pages, 2020.

* cited by examiner

*Primary Examiner* — Anh Q Tran
(74) *Attorney, Agent, or Firm* — Finnegan, Henderson, Farabow, Garrett & Dunner, LLP

(57) ABSTRACT

Systems and methods are provided for implementing arbitrary single-qubit quantum gates using sequences of single-qubit quantum gates. The systems and methods can implement a first quantum gate in a gate sequence by applying a first sequence of phase-shifted pulses to the qubit. After applying the first quantum gate, a second quantum gate in the gate sequence can be implemented by applying a second sequence of phase-shifted pulses to the qubit. The implementation of the second quantum gate can introduce an additional rotation. This additional rotation can be independent of the implementation of the first quantum gate. A pulse in the second sequence can be configured to implement: a virtual Z gate having a first rotation angle; an X gate having a second rotation angle; and the virtual Z gate having a negative of the first rotation angle.

23 Claims, 5 Drawing Sheets

IMPLEMENTING QUBIT GATES USING PHASE-SHIFTED MICROWAVE PULSES

TECHNICAL FIELD

The present disclosure generally relates to quantum computing, and more particularly, to implementation of qubit gates using phase-shifted microwave pulses.

BACKGROUND

Quantum computations are performed on quantum bits, or qubits. Such computations can be performed by quantum gates, which are analogous to the logic gates of digital computations. A quantum computer can be configured to implement arbitrary quantum gates using sequences of other basic quantum gate(s). The performance of the quantum computer can depend on the selection of basic quantum gate(s) and how those gates are combined to implement the arbitrary quantum gates. For example, the quantum computer may only be able to apply a limited number of the basic quantum gate(s) before the targeted qubit(s) become decoherent due to noise. The length of the sequences used to implement the arbitrary quantum gates may therefore determine the number of arbitrary quantum gates that the quantum computer can apply. Furthermore, the selection of basic quantum gate(s) can affect the fidelity of the arbitrary quantum gates and the calibration requirements of the quantum computer.

SUMMARY

The disclosed systems and methods relate to implementation of arbitrary single-qubit gates using sequences of one or more phase-shifted microwave pulses. Disclosed embodiments can reduce the calibration requirements for a quantum computer, reduce the number of microwave pulses required to implement the arbitrary single-qubit quantum gate, or support improved integration of two-qubit gates with single-qubit gates implemented using phase-shifted microwave pulses.

The disclosed embodiments include a system for applying a single-qubit quantum gate having a unitary specifiable by at least a first real parameter, a second real parameter, and a third real parameter. The system can include a qubit and a quantum controller coupled to the qubit by a driveline. The quantum controller can be configured to apply a sequence of phase-shifted Pauli gates to the qubit to implement the single-qubit quantum gate, each phase-shifted Pauli gate in the sequence having a rotation angle and a phase shift. The first, second, and third real parameters of the unitary can correspond to a rotation angle in the sequence and the phase shifts in the sequence, or the phase shifts in the sequence.

The disclosed embodiments include a method for applying a gate sequence of quantum gates to a qubit. The method can include operations of implementing a first quantum gate in the gate sequence by applying a first sequence of phase-shifted pulses to the qubit. The method can include further operations of implementing a second quantum gate in the gate sequence, after applying the first quantum gate. The second quantum gate can be implemented by applying a second sequence of phase-shifted pulses to the qubit. An additional rotation introduced by the implementation of the second quantum gate can be independent of the implementation of the first quantum gate. A pulse in the second sequence can be configured to implement a virtual Z gate having a first rotation angle, an X gate having a second rotation angle, and the virtual Z gate having a negative of the first rotation angle.

The disclosed embodiments include a method for implementing a composition of a two-qubit gate and the tensor product of a first single-qubit gate and a second single-qubit gate. The method can further include operations of applying a first sequence of phase-shifted pulses to a first qubit, applying a second sequence of phase-shifted pulses to a second qubit, and applying the two-qubit gate to the first qubit and the second qubit. Applying the first sequence of phase-shifted pulses to the first qubit can implement the first single-qubit gate. This implementation of the first single-qubit gate can introduce an additional rotation phase shift. Applying the second sequence of phase-shifted pulses to a second qubit can implement a product of the additional rotation and the second single-qubit gate. The two-qubit gate to the first qubit and the second qubit can be applied to obtain a phase-shifted version of the composition of the two-qubit gate and the tensor product of the first single-qubit gate and the second single-qubit gate.

The disclosed embodiments include a non-transitory computer-readable medium containing instructions that are executable by a processor of a quantum controller. The quantum controller can be coupled to a qubit. The instructions can be executable to cause the quantum controller to perform operations for applying a single-qubit quantum gate to the qubit. The single-qubit quantum gate can have a unitary specifiable by a first, a second, and a third real parameter. The operations can include applying to the qubit a sequence of phase-shifted Pauli gates. Each phase-shifted Pauli gate in the sequence can have a rotation angle and a phase shift. The first, second, and third real parameters can correspond to a rotation angle and the phase shifts in the sequence; or to the phase shifts in the sequence.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which comprise a part of this specification, illustrate several embodiments and, together with the description, serve to explain the principles and features of the disclosed embodiments. In the drawings.

DETAILED DESCRIPTION

Figure 1:
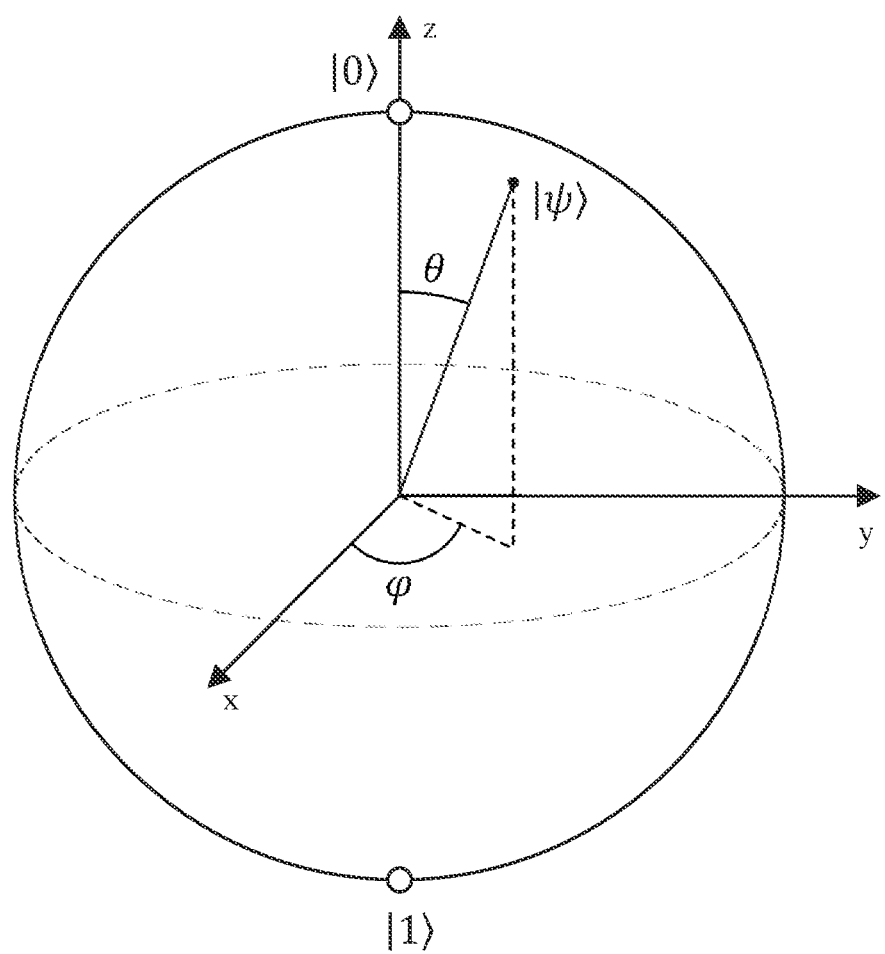
FIG. 1 depicts a Bloch sphere representation of a qubit, in accordance with disclosed embodiments.

Reference will now be made in detail to exemplary embodiments, discussed with regards to the accompanying drawings. In some instances, the same reference numbers will be used throughout the drawings and the following description to refer to the same or like parts. Unless otherwise defined, technical or scientific terms have the meaning commonly understood by one of ordinary skill in the art. The disclosed embodiments are described in sufficient detail to enable those skilled in the art to practice the disclosed embodiments. It is to be understood that other embodiments may be utilized and that changes may be made without departing from the scope of the disclosed embodiments. Thus, the materials, methods, and examples are illustrative only and are not intended to be necessarily limiting.

Quantum computers offer the ability to perform certain tasks (equivalently, solve certain problems) thought to be intractable to classical computers, including any possible future classical computers. To understand the advantage of quantum computers, it is useful to understand how they contrast to classical computers. A classical computer operates according to digital logic. Digital logic refers to a type of logic system that operates on units of information called bits. A bit may have one of two values, usually denoted 0 and 1, and is the smallest unit of information in digital logic. Operations are performed on bits using logic gates, which take one or more bits as input and give one or more bits as output. Typically, a logic gate usually only has one bit as output (though this single bit may be sent as input to multiple other logic gates) and the value of this bit usually depends on the value of at least some of the input bits. In modern-day computers, logic gates are usually composed of transistors and bits are usually represented as the voltage level of wires connecting to the transistors. A simple example of a logic gate is the AND gate, which (in its simplest form) takes two bits as input and gives one bit as output. The output of an AND gate is 1 if the value of both inputs is 1 and is zero otherwise. By connecting the inputs and outputs of various logic gates together in specific ways, a classical computer can implement arbitrarily complex algorithms to accomplish a variety of tasks.

On a surface level, quantum computers operate in a similar way to classical computers. A quantum computer operates in quantum logic. Quantum logic, as used herein, refers to a system of logic that operates on units of information referred to as "quantum bits" or simply "qubits." A qubit is the smallest unit of information in quantum computers, and can have any linear combination of two values, usually denoted $|0\rangle$ and $|1\rangle$. The value of the qubit can be denoted $|\psi\rangle$. Different from a digital bit that can have a value of either "0" or "1," $|\psi\rangle$ can have a value of $\alpha|0\rangle + \beta|1\rangle$ where $\alpha$ and $\beta$ are complex numbers (referred to as "amplitudes") not limited by any constraint except $|\alpha|^2+|\beta|^2=1$. Qubits can be constructed in various forms and can be represented as quantum states of components of the quantum computer. For example, a qubit can be physically implemented using photons (e.g., in lasers) with their polarizations as the quantum states, electrons or ions (e.g., trapped in an electromagnetic field) with their spins as the quantum states, Josephson junctions (e.g., in a superconducting quantum system) with their charges, current fluxes, or phases as the quantum states, quantum dots (e.g., in semiconductor structures) with their dot spin as the quantum states, topological quantum systems, or any other system that can provide two or more quantum states. The quantum logic can use quantum logic gates (or simply "quantum gates") to create, remove, or modify qubits.

Mathematically, a quantum gate is a propagator acting on a quantum state. A quantum gate can take one or more qubits as input and give one or more qubits as output, and thus can be represented as a matrix. Unlike classical logic gates (e.g., the AND gate), a quantum gate has a characteristic that its input can be determined based on its output and information of the transformation it applies, which is referred to as "reversible." Such a reversible characteristic necessitates that the number of outputs of a quantum gate equals to or exceeds the number of its inputs and ensures that the input to a known quantum gate can always be constructed given its output.

Physically, a quantum gate can be implemented as a hardware device capable of generating laser pulses, electromagnetic waves (e.g., microwave pulses), electromagnetic fields, or any means for changing, maintaining, or controlling the quantum states of the qubits. Superconducting quantum circuits can be used to implement qubits and quantum gates. Such qubits can be based on currents (e.g., flux qubits) or charges (e.g., charge qubits), or energy (e.g., phase qubits). Different implementations can have different characteristics, such as sensitivity to external noise, coherence time, or anharmonicity. For example, a transmon qubit, a type of charge qubit including a capacitively shunted Josephson junction, can exhibit a reduced sensitivity to charge noise. As an additional example, fluxonium qubit, a type of flux qubit including a Josephson junction shunted by a capacitor and an inductor (the latter realizable using an array of additional Josephson junctions), can exhibit long coherence times and large anharmonicity.

One way of visualizing a value of a qubit is to present the qubit as a point on a surface of a Bloch sphere. By way of example, FIG. 1 is a diagram illustrating a qubit represented in a Bloch sphere 100, consistent with some embodiments of this disclosure. Bloch sphere 100 can be conceptualized as existing in a three-dimensional (3D) space with coordinate axes x, y, and z, respectively. It takes two values (e.g., latitude and longitude, or angles $\varphi$ and $\theta$ in FIG. 1) to represent a point on the surface of Bloch sphere 100. In FIG. 1, the positive and negative poles of the z-axis correspond to $|0\rangle$ and $|1\rangle$, respectively. For a qubit $|\psi\rangle = \alpha|0\rangle + \beta|1\rangle$, because $\alpha$ and $\beta$ are complex numbers constrained by $|\alpha|^2+|\beta|^2=1$, $|\psi\rangle$ can be represented as a complex number $a+bi$. The values of a and b can be mapped to azimuthal and equatorial angles $\varphi$ and $\theta$ in Bloch sphere 100, which in turn can be represented as a point on the surface of Block sphere 100 in FIG. 1.

Typically, quantum algorithms can be expressed in terms of their underlying quantum circuits. A quantum circuit includes one or more quantum gates. Because a quantum gate can transform a qubit in an infinite number of ways (e.g., by changing the values of a and in a qubit $\alpha|0\rangle + \beta|1\rangle$ ), there are infinite types of quantum gates. For example, there are infinite quantum gates for performing unitary transformations on qubits because there are an infinite number of ways to perform the unitary transformations. One type of quantum gates, known as "Pauli operators" or "Pauli gates," can be used to perform unitary transformations on qubits. There are four Pauli operators, referred to as I, X, Y, and Z, respectively, where I is the identity operator, and X, Y, and Z represent 180° rotations around the x-axis, y-axis, and z-axis in 3D space, respectively. For example, in system of two-state qubits, the Pauli gates can be represented as matrices $$I = \begin{pmatrix} 1 & 0 \\ 0 & 1 \end{pmatrix}, X = \begin{pmatrix} 0 & 1 \\ 1 & 0 \end{pmatrix}, Y = \begin{pmatrix} 0 & -i \\ i & 0 \end{pmatrix}, \text{ and } Z = \begin{pmatrix} 1 & 0 \\ 0 & -1 \end{pmatrix}.$$

The set of Pauli operators on n qubits can be defined as $\mathcal{P}_n = \{\sigma_1 \otimes \ldots \otimes \sigma_n | \sigma_i \in \{I, X, Y, Z\}\}$ and $|\mathcal{P}_n| = 4^n$, where subscripts indicate the qubits on which an operator acts. For a set of n qubits, there are $4^n$ Pauli matrices, each for a possible tensor product (in the form $\{\sigma_1 \otimes \ldots \otimes \sigma_n\}$) of $\sigma_i \in [I, X, Y, Z]$. For example, in a three-qubit system including three qubits $|\psi_1\rangle$, $|\psi_2\rangle$ and $|\psi_3\rangle$, a Pauli X gate acting on $|\psi_1\rangle$ and a Pauli Z gate acting on $|\psi_2\rangle$ can be represented as $X_1 Z_2 = X_1 Z_2 I_3 = X_1 \times Z_2 \times I_3 = (X \otimes I \otimes I) \times (I \otimes Z \otimes I) \times (I \otimes I \otimes I) = X \otimes Z \otimes I$.

The Pauli gates can be understood as rotations around the three principal axes of the Bloch sphere. By way of example, with reference to FIG. 1, the Pauli X gate, Pauli Y gate, and Pauli Z gate can be understood as causing the point representing $|V\rangle)$ to rotate by 180° around the x-axis, y-axis, and z-axis in Bloch sphere 100, respectively.

Single quantum gates can be implemented using sequences of other quantum gates, for example by combining arbitrary Pauli rotations or continuously parametrized geometric gates. But the relationship between gate parameters and the physical control parameters of the system may be complicated. For example, a Pauli X gate can be obtained by providing a microwave pulse to a superconducting quantum circuit implementing a qubit. The rotation angle θ of the Pauli X gate may depend on a combination of the waveform, length, and amplitude of the microwave pulse. Furthermore, this relationship can be affected by a pulse distortions or leakage of quantum information outside the computational subspace. Accordingly, in this example, accurate implementation of the Pauli X gate may require tuning or calibration of the waveform, length, and amplitude of the microwave pulse.

Figure 2:
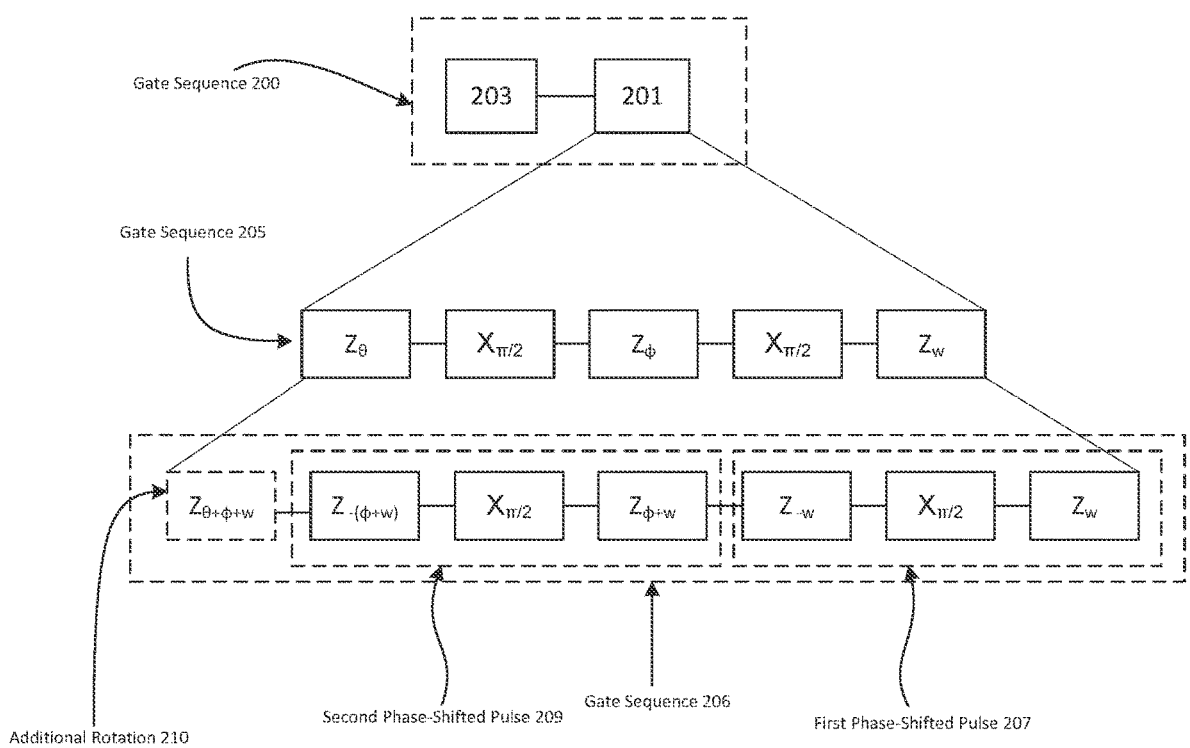
FIG. 2 depicts a first, approximate implementation of an arbitrary single-qubit quantum gate using phase-shifted microwave pulses, in accordance with disclosed embodiments.

As depicted in FIG. 2, some single quantum gate implementations support more straightforward relationships between gate parameters and physical control parameters. FIG. 2 depicts an exemplary gate sequence 200, including two single-qubit gates in sequence (gates 201 and 203). As shown in FIG. 2, the single-qubit gate 201 can be implemented using gate sequence 205, as follows:

$$Z_\theta X_{\pi/2} Z_\varphi X_{\pi/2} Z_\omega$$

where $Z_\theta$ is an arbitrary Z-rotation:

$$Z_\theta \equiv e^{-i\frac{\theta}{2} Z} = \begin{bmatrix} e^{i\frac{\theta}{2}} & 0 \\ 0 & e^{-i\frac{\theta}{2}} \end{bmatrix}$$

where $X_{\pi/2}$ is a π/2 X-rotation:

$$X_{\pi/2} \equiv e^{-i\frac{\pi}{4} X} = \frac{1}{\sqrt{2}} \begin{bmatrix} 1 & -i \\ -i & 1 \end{bmatrix}$$

and where X, Y, and Z are the Pauli operators.

Gate sequence 205 can be approximately realized using phase-shifted microwave (PMW) pulses. Given a microwave pulse that implements an $X_{\pi/2}$ gate, phase-shifting the microwave pulse can cause the microwave pulse to implement the gate sequence $Z_{-\omega} X_{\pi/2} Z_\omega$. In this manner, given a calibrated $X_{\pi/2}$ gate, an additional "virtual" $Z_\omega$ gate can be produced using only one physical control parameter: the phase shift co. Unlike the microwave pulse waveform, length, and amplitude in the general case, in this case the physical control parameter (the phase shift) maps directed to the gate parameter (the Z-rotation). In some instances, only the $X_{\pi/2}$ gate need be calibrated, thereby reducing the calibration requirements of the system. Additionally, the phase shift can be precisely controlled (e.g., using a global frequency reference such as an atomic clock, or the like).

The disclosed embodiments realizes arbitrary single qubit gates (e.g., using superconducting circuits or the like) using phase-shifted microwave (PMW) pulses. In some embodiments, a PMW pulse can realize an X gate. By adding a phase-shift φ to the X gate, the X gate can be conjugated with $Z_\varphi$ gate. In a first general case, an arbitrary single qubit gate can be realized using two PMW $X_{\pi/2}$ gates and one PMW $X_\pi$ gate, where π/2 and π denote the angle of rotation of the unshifted X pulse. In some special cases, a single qubit gate can be realized using only one or two PMW X gates. In a second general case, an arbitrary single qubit gate can be realized using a PMW $X_{\pi/2}$ gates and a PMW $X_\sigma$ gate, where σ denotes a rotation selected based on the unitary of the arbitrary single qubit gate being realized. The disclosed systems and methods can support quantum computation on superconducting circuits with minimal necessary X-pulse calibration.

Gate sequence 206, depicted in FIG. 2, can approximately implement gate sequence 205 using a sequence of PMW pulses. The sequence of PMW pulses can include a first phase-shifted pulse 207 and a second phase-shifted pulse 209. Pulse 207 generates the gate sequence $Z_{-\omega} X_{\pi/2} Z_\omega$, introducing an additional $Z_{-\omega}$ rotation. Pulse 209 generates the gate sequence $Z_{-(\varphi+\omega)} X_{\pi/2} Z_{\varphi+\omega}$, thereby compensating for the $Z_{-\omega}$ rotation introduced by pulse 207. But pulse 209 introduces an additional $Z_{-(\varphi+\omega)}$ rotation. To implement gate sequence 205, gate sequence 206 would therefore require an additional $Z_{(\theta+\varphi+\omega)}$ gate to compensate for the $Z_{-(\varphi+\omega)}$ rotation introduced by pulse 209.

Rather than providing the additional rotation as part of gate sequence 206, known methods for implementing arbitrary single-qubit gates may provide the compensatory $Z_{(\theta+\varphi+\omega)}$ rotation by phase shifting subsequent single-qubit gates. For example, to implement the single-qubit gate sequence $U_2 U_1$, where:

$$U_1 = Z_{\theta_1} X_{\pi/2} Z_{\varphi_1} X_{\pi/2} Z_{\omega_1}$$

$$U_2 = Z_{\theta_2} X_{\pi/2} Z_{\varphi_2} X_{\pi/2} Z_{\omega_2}$$

$U_2$ can be shifted as follows:

$$U_2 \to Z_{-(\theta_1+\varphi_1+\omega_1)} U_2 Z_{(\theta_1+\varphi_1+\omega_1)} \to Z_{\theta_2-(\theta_1+\varphi_1+\omega_1)}$$
$$X_{\pi/2} Z_{\varphi_2} X_{\pi/2} Z_{(\omega_2+(\theta_1+\varphi_1+\omega_1))}$$

The phase-shifted $U_2$ gate can be implemented using two PMW pulses:

$$PMW_1 = Z_{-(\omega_2+\theta_1+\varphi_1+\omega_1)} X_{\pi/2} Z_{(\omega_2+\theta_1+\varphi_1+\omega_1)}$$

$$PMW_2 = Z_{-(\varphi_2-\omega_2+\theta_1+\varphi_1+\omega_1)} X_{\pi/2} Z_{(\varphi_2+\omega_2+\theta_1+\varphi_1+\omega_1)}$$

As before, an additional rotation (e.g., $Z_{(\theta_2+\varphi_2+\omega_2)+(\theta_1+\varphi_1+\omega_1)}$) would be required to implement the phase-shifted $U_2$ gate. This additional rotation may be carried on to the next single-qubit gate in the sequence.

While the phase-shifting approach may be suitable for sequences of single qubit gates, this approach may be incompatible with certain two-qubit gates, such as CNOT, $\sqrt{SWAP}$, or $\sqrt{iSWAP}$ gates.

The disclosed systems and methods can support the generation of arbitrary single-qubit gates using PMW pulse(s). The PMW pulse(s) can be applied to realize gates of the form $Z_{-\omega}X_{\pi/2}Z_{\omega}$, which can be concatenated to implement the arbitrary single-qubit gate. As disclosed herein, these PMW pulse(s) can implement the arbitrary single-qubit gates without necessarily introducing an additional Z-rotation. Therefore, the disclosed systems and methods can be compatible with any two-qubit gate. The disclosed systems and methods also maintain the benefits of using of PMW pulse(s) (e.g., control parameter accuracy; reduced calibration requirements; a clear association between physical control parameters, such as phase shift, and gate parameters, such as Z-rotation angle; and the like). Accordingly, the disclosed systems and methods constitute an improvement in the technical field of quantum computing.

Figure 3A:
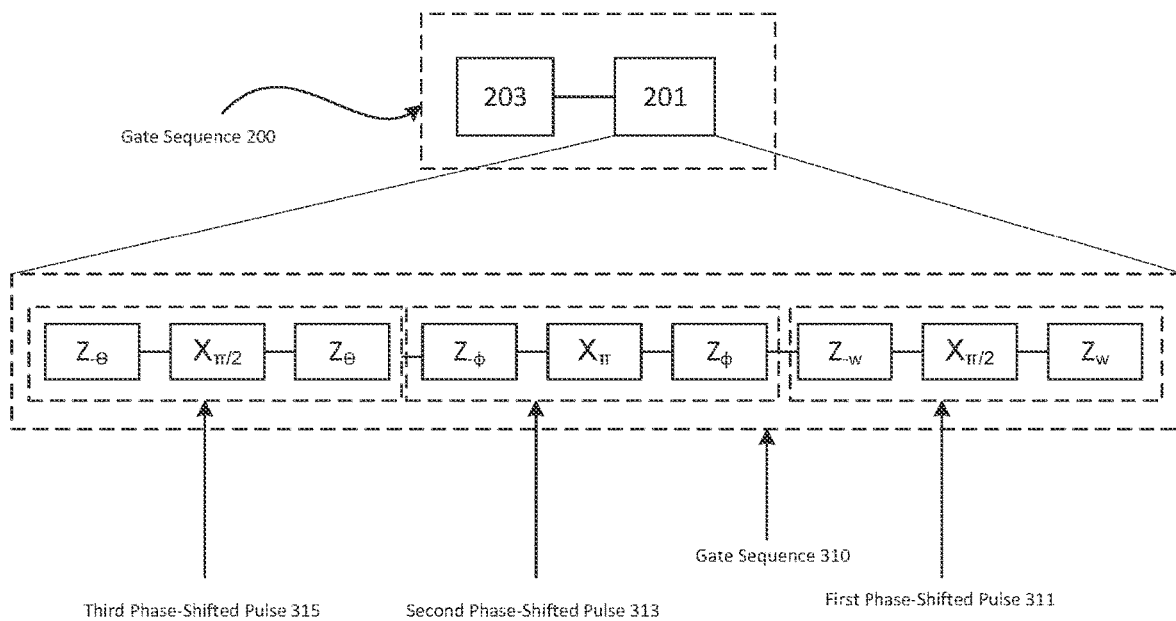
FIGS. 3A and 3B depict two differing implementations of an arbitrary single-qubit quantum gate using phase-shifted microwave pulses, in accordance with disclosed embodiments.
Figure 3B:
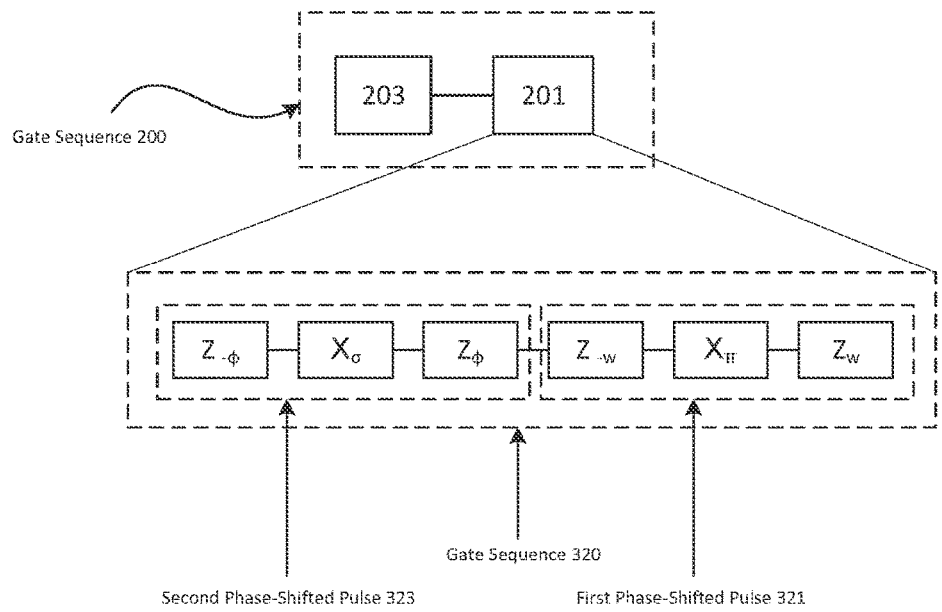

FIGS. 3A and 3B depict two differing methods for implementing an arbitrary single-qubit quantum gate using phase-shifted microwave pulses, in accordance with disclosed embodiments. Both methods use a sequence of one or more PMW pulses. In some embodiments, the PMW pulses can be phase-shifted X gates.

Consistent with the depiction in FIG. 3A, the real parameters of a single-qubit unitary can be mapped to phase-shifts for the gates in gate sequence 310. Accordingly, for any single-qubit unitary, a linear system can be solved to determine the appropriate phase-shifts for implementing that single-qubit unitary. In some embodiments, the phase-shifted X gates in gate sequence 310 can be selected from the group consisting of $X_{\pi/2}$ and $X_{\pi}$ gates.

In a general case, the single-qubit quantum gate 201 can be implemented using gate sequence 310. This gate sequence can include three PMW pulses: a first phase-shifted pulse 311 (realizing a phase-shifted $X_{\pi/2}$ gate), a second phase-shifted pulse 313 (realizing a phase-shifted $X_{\pi}$ gate), and a third phase-shifted pulse 313 (realizing a phase-shifted $X_{\pi/2}$ gate).

Concatenation of three PMW pulses yields the following matrix:

$$Z_{-\theta}X_{\pi/2}Z_{\theta}Z_{-\varphi}X_{\pi}Z_{\varphi}Z_{-\omega}X_{\pi/2}Z_{\omega} = \begin{bmatrix} -e^{i(\theta-\omega)/2}\cos\frac{(\theta-2\varphi+\omega)}{2} & -e^{i(\theta+\omega)/2}\sin\frac{(\theta-2\varphi+\omega)}{2} \\ e^{-i(\theta+\omega)/2}\sin\frac{(\theta+2\varphi+\omega)}{2} & -e^{-i(\theta-\omega)/2}\cos\frac{(\theta-2\varphi+\omega)}{2} \end{bmatrix}$$

The general form of a single-qubit gate can be expressed as an element of the special unitary group of degree 2, with three real parameters, as follows:

$$U(\alpha, \beta, \gamma) = \begin{bmatrix} e^{i\alpha}\cos\gamma & -e^{i\beta}\sin\gamma \\ e^{-i\beta}\sin\gamma & e^{-i\alpha}\cos\gamma \end{bmatrix}$$

By examination, the matrix for the three PMW pulses equals $U(\alpha,\beta,\gamma)$ when:

$(\theta-2\varphi+\omega)/2=\pi-\gamma$ $(\theta-\omega)/2=\alpha$ $(\theta+\omega)/2=\beta$ Directly solving this linear system yields:

$\theta=\alpha-\beta$ $\varphi=-\beta+\gamma-\pi$ $\omega=-\alpha-\beta$

Accordingly, an arbitrary single-qubit gate can be realized using two PMW $X_{\pi/2}$ gates and one PMW $X_{\pi}$ gate, as follows:

$U(\alpha,\beta,\gamma)=Z_{-\alpha-\beta}X_{\pi/2}Z_{\alpha-\beta}Z_{\beta-\gamma+\pi}X_{\pi}Z_{-\beta+\gamma-\pi}Z_{\alpha+\beta}X_{\pi/2}Z_{-\alpha-\beta}$ In accordance with disclosed embodiments, following calibration of the $X_{\pi/2}$ gate and the $X_{\pi}$ gate, an arbitrary single-qubit gate can be realized without requiring further calibration. As calibration of the $X_{\pi/2}$ gate and the $X_{\pi}$ gate may be performed during initialization or characterization of the quantum computer (e.g., as part of a Clifford-based randomized benchmarking, T1 relaxation, 12 echo measurements, or the like), the disclosed embodiments can reduce calibration requirements for performing quantum calculations.

In some instances, fewer than three PMW pulses may be required to realize a qubit. The unitary $U(\alpha,\beta,\gamma)$ can be decomposed into Pauli operators:

$U(\alpha,\beta,\gamma)=\cos\gamma[\cos(\alpha)I+\sin(\alpha)iZ]+\sin\gamma[\sin(\beta)iX-\cos((\beta)iY]$ When $\gamma$ is $\pi/2$, the diagonal terms of $U(\alpha,\beta,\gamma)$ are zero. The decomposition of $U(\alpha,\beta,\gamma)$ can into Pauli operators becomes:

$U(\alpha,\beta,\pi/2)=\sin(\beta)iX-\cos(\beta)iY$

Applying a single PMW $X_{\pi}$ yields a unitary as follows:

$Z_{-\varphi}X_{\pi}Z_{\varphi}=-\cos(\varphi)iX+\sin(\varphi)iY$

Equating the coefficients of iX and iY yields $\varphi=-\beta+3\pi/2$. Thus, through an appropriate selection of $\varphi$, a single PMW $X_{\pi}$ gate can be used to realize single-qubit gates having support only on iX and iY.

When $\gamma$ is $\pi$, the off-diagonal terms of $U(\alpha,\beta,\gamma)$ are zero. The decomposition of $U(\alpha,\beta,\gamma)$ into Pauli operators becomes:

$U(\alpha,\beta,\pi)=\cos(\alpha)I+\sin(\alpha)iZ$

Applying a two PMW $X_{\pi}$ pulses yields a unitary as follows:

$Z_{-\theta}X_{\pi}Z_{\theta}Z_{-\varphi}X_{\pi}Z_{\varphi}=-\cos(\theta-\varphi)I-\sin(\theta-\varphi)iZ$ Equating the coefficients of I and iZ yields $\theta-\varphi=\alpha+\pi$. Thus, through an appropriate selection of $\theta$ and $\varphi$, two PMW $X_{\pi}$ gates can be used to realize single-qubit gates having support only on I and iZ.

Furthermore, the gates used for single-qubit Clifford-based randomized benchmarking can be produced using just one PMW $X_{\pi/2}$ pulse for each benchmarking gate.

$X_{\pi/2}=Z_0 X_{\pi/2} Z_0$ $X_{-\pi/2}=Z_{-\pi} X_{\pi/2} Z_{\pi}$ $Y_{\pi/2}=Z_{\pi/2} X_{\pi/2} Z_{-\pi/2}$ $Y_{-\pi/2}=Z_{-\pi/2} X_{\pi/2} Z_{\pi/2}$

Consistent with the depiction in FIG. 3B, the real parameters of the single-qubit unitary can be mapped to a combination of gate phase-shifts and a gate rotation angle in gate sequence 320. Accordingly, for any single-qubit unitary, a linear system can be solved to determine the appropriate phase-shifts and gate rotation angle for implementing that single-qubit unitary.

In some embodiments, one phase-shifted X gate in gate sequence 320 can be a $X_{\pi}$ gate. The unitary of the single-qubit gate being implemented by gate sequence 320 can determine the phase shift a of the other phase-shifted X gate in gate sequence 320.

A direct calculation of the unitary for the concatenation of an arbitrary-rotation PMW gate and a PMW $X_\pi$ gate yields:

$$Z_{-\varphi}X_\sigma Z_\varphi Z_{-\omega}X_\pi Z_\omega =$$
$$\cos\frac{\sigma}{2}[-\cos(\omega)iX + \sin(\omega)iY] - \sin\frac{\sigma}{2}[\cos(\varphi-\omega) + \sin(\varphi-\omega)iY]$$

A first PMW pulse (e.g., first phase-shifted pulse 321) can implement the sequence of gates:

$$Z_{-\omega}X_\pi Z_\omega$$

A second PMW pulse (e.g., second phase-shifted pulse 323) can implement the sequence of gates:

$$Z_{-\varphi}X_\pi Z_\varphi$$

Accordingly, the method depicted in FIG. 3B can implement an arbitrary single-qubit quantum gate using two PMW pulses. As described above, the unitary $U(\alpha,\beta,\gamma)$ can be decomposed into Pauli operators:

$$U(\alpha,\beta,\gamma)=\cos\gamma[\cos(\alpha)I+\sin(\alpha)iZ]+\sin\gamma[\sin(\beta)iX-\cos(\beta)iY]$$

Equating variables yields the linear system:

$$\sigma=2\gamma-\pi$$

$$\phi=3\pi/2+\alpha-\beta$$

$$\omega=3\pi/2-\beta$$

This linear system can be solved to determine appropriate values of $\sigma$, $\varphi$, and $\omega$ for implementing the unitary $U(\alpha,\beta,\gamma)$.

As compared to the method of FIG. 3A, the method of FIG. 3B may reduce the number of pulses required to realize a quantum computation, therefore providing an implementation-dependent improvement in gate fidelity. However, this method may involve an additional calibration of the $X_\sigma$ gate, as the $X_\sigma$ gate (unlike, for example, the $X_{\pi/2}$ and $X_\pi$ gate) may not otherwise be calibrated during initialization or characterization of the quantum computer.

Consistent with disclosed embodiments, gate sequence 310 can be used to implement an additional Z rotation. In some embodiments, a need for an additional Z rotation (e.g., in response to frame shifts or other effects) can be determined during a quantum computation. In response to the determination, the additional Z rotation can be implemented during application of a gate sequence by updating PMW phase shifts using the following update rules.

Given $\alpha$, $\beta$, $\gamma$, and $\delta$ (where the sum of $\alpha$, $\beta$, $\gamma$, and $\delta$ need not equal zero), a sequence of gates $Z_\delta X_{\pi/2} Z_\gamma X_\pi Z_\beta X_{\pi/2} Z_\alpha$, and the identity:

$$Z_{x-\varphi}X_\pi Z_{x+\varphi}=Z_{-\varphi}X_\pi Z_\varphi,$$

the sequence of gates can be expressed in terms of PMW pulses as follows:

$$Z_\delta X_{\pi/2} Z_\gamma X_\pi Z_\beta X_{\pi/2} Z_\alpha = (Z_{-(-\delta)}X_{\pi/2}Z_{-\delta})(Z_{\gamma+\delta}X_\pi Z_{\alpha+\beta})(Z_{-\alpha}X_{\pi/2}Z_\alpha)$$

$$Z_\delta X_{\pi/2} Z_\gamma X_\pi Z_\beta X_{\pi/2} Z_\alpha = (Z_{-(-\delta)}X_{\pi/2}Z_{-\delta})(Z_{-(\alpha+\beta-\gamma-\delta)/2}X_\pi Z_{(\alpha+\beta-\gamma-\delta)/2})(Z_{-\alpha}X_{\pi/2}Z_\alpha).$$

Accordingly, the final Z rotation value $\delta$ can be updated by changing the phase shift for the middle and final pulses (e.g., to implement $\delta \to \delta+\Delta\delta$, the phase-shift of the final pulse decreases by $\Delta\delta$ and the phase shift of the middle pulse decreases by $\Delta\delta/2$). Likewise, the first Z rotation value $\alpha$ can be updated by changing the phase shift for the first and middle pulses (e.g., to implement $\alpha \to \alpha+\Delta\alpha$, the phase-shift of the first pulse increases by $\Delta\alpha$ and the phase shift of the middle pulse increases by $\Delta\alpha/2$). Similarly, the Z rotation values $\gamma$ and $\beta$ can be updated by updating the phase-shift of the middle pulse.

Figure 4A:
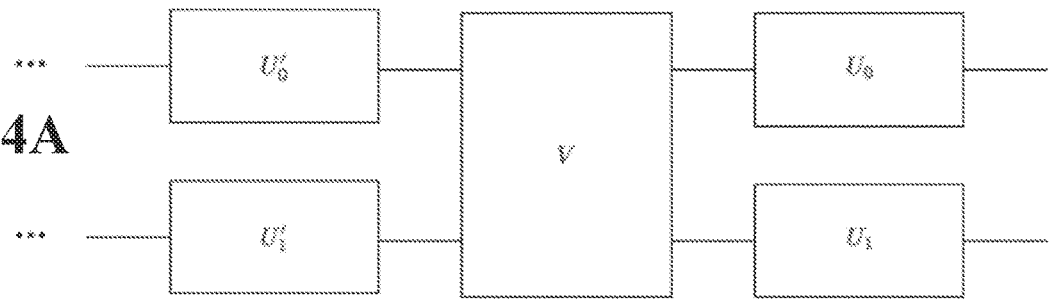
FIG. 4A depicts a sequence of quantum gates including a two-qubit quantum gate, in accordance with disclosed embodiments.

FIG. 4A depicts a sequence of quantum gates including a two-qubit quantum gate, in accordance with disclosed embodiments. As depicted, two single-qubit gates $U_0$ and $U_1$ can be applied to two separate qubits in parallel. A two-qubit gate V can then be applied to both qubits. Two-single qubit gates $U_0'$ and $U_1'$ can then be applied to two separate qubits in parallel.

In the general case, single-qubit gates $U_0$ and $U_1$ can differ. Accordingly, when implemented using the gate sequence of FIG. 2, differing additional rotations will be introduced for these two gates. In the general case, such differing additional rotations cannot be carried through the two-qubit gate V.

However, in some instances, Z rotations can be carried through the two-qubit gate V. For a symmetric-phase-commuting two-qubit gate (e.g., an $\sqrt{iSwap}$ gate, or the like):

$$\forall \theta, \exists \theta_0, \theta_1 \; s.t. \; V(Z_\theta \otimes Z_\theta) = (Z_{\theta_0} \otimes Z_{\theta_1})V$$

Thus, a common Z rotation $\theta$ can be carried through the two-qubit gate V, potentially with some updating (e.g., $\theta \to \theta_0$ and $\theta \to \theta_1$) for each of the qubits. In some embodiments, as depicted in FIGS. 4A to 4D, the two-qubit gate V may be an excitation-number-conserving qubit gate. In such embodiments, $\theta=\theta_0=\theta_1$.

Figure 4B:
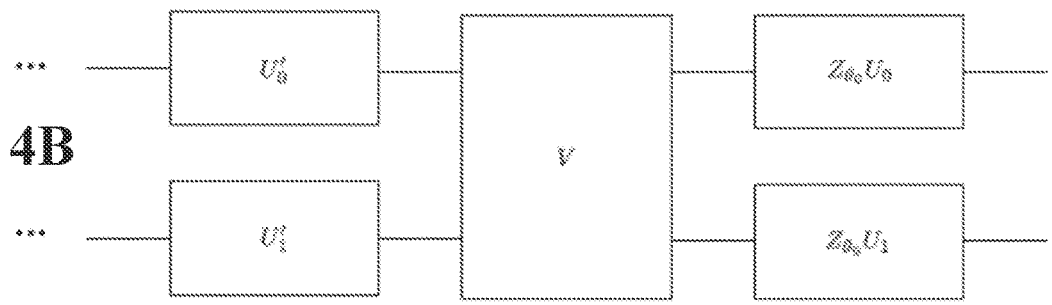
FIGS. 4B to 4D depict an implementation of the sequence of quantum gates of FIG. 4A using the single-qubit quantum gate implementation of either FIG. 3A or 3B, in accordance with disclosed embodiments.
Figure 4C:
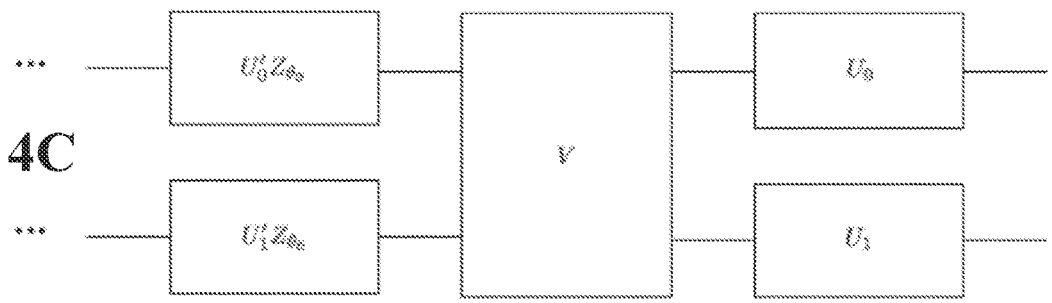
Figure 4D:
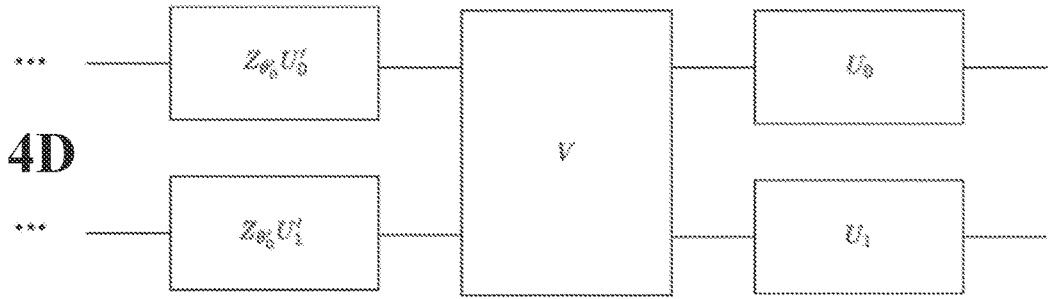

FIGS. 4B to 4D depict example implementations of the sequence of quantum gates of FIG. 4A using the single-qubit quantum gate implementation of either FIG. 3A or 3B, in accordance with disclosed embodiments.

As depicted in FIG. 4B, in a first step of this implementation, the gate $U_0$ can be applied to a first qubit using the method depicted in FIG. 2. Accordingly, when:

$$U_0 = Z_{\theta_0} X_{\pi/2} Z_{\varphi_0} X_{\pi/2} Z_{\omega_0},$$

the method depicted in FIG. 2 may introduce an additional rotation:

$$U_0 \to Z_{-(\theta_0+\varphi_0+\omega_0)} U_0.$$

In some embodiments, the method depicted in FIG. 2 may be used, even through it introduces the additional rotation, because it requires only two PMW pulses (and therefore may support improved gate fidelity, as compared to implementations requiring additional pulses).

In parallel with the application of gate $U_0$, a phase-shifted version of gate $U_1$ can be applied to a second qubit using the method of FIG. 3A, the method of FIG. 3B, or by updating an existing implementation of gate $U_1$.

As a non-limiting example of the method of FIG. 3A:

$$Z_{-(\theta_0+\varphi_0+\omega_0)} U_1 = Z_{-\theta_1} X_{\pi/2} Z\theta_1 Z_{-\varphi_1} X_\pi Z_{\varphi_1} Z_{-\omega_1} X_{\pi/2} Z_{\omega_1}.$$

As a non-limiting example of the method of FIG. 3B:

$$Z_{-(\theta_0+\varphi_0+\omega_0)} U_1 = Z_{-\varphi_1} X_\sigma Z_{\varphi_1} Z_{-\omega_1} X_{\pi/2} Z_{\omega_1}.$$

As a non-limiting example of an existing implementation of gate $U_1$:

$$U_1 = Z_\delta X_{\pi/2} Z_\gamma X_\pi Z_\beta X_{\pi/2} Z_\alpha,$$

by applying an update as described above:

$$Z_{-(\theta_0+\varphi_0+\omega_0)}U_1 = (Z_{-(-\delta+(\theta_0+\varphi_0+\omega_0))}Y_{\pi/2}$$
$$Z_{-\delta+(\theta_0+\varphi_0+\omega_0)}) \cdots$$

$$\cdots (Z_{-(\alpha+\beta-\gamma-\delta+(\theta_0+\varphi_0+\omega_0))/2}X_\pi Z_{(\alpha+\beta-\gamma-\delta+(\theta_0+\varphi_0+\omega_0))/2})$$
$$(Z_{-\alpha}X_{\pi/2}Z_\alpha)$$

According to any one of these implementations, $U_1 \to Z_{-(\theta_0+\varphi_0+\omega_0)}U_1$. Accordingly, as depicted in FIG. 4C, the $Z_{-(\theta_0+\varphi_0+\omega_0)}$ rotation can be treated as having commuted with the two-qubit gate V. As depicted in FIG. 4D, the method of FIG. 2 can then be used to carry the phase shifts forward. Additionally or alternatively, the method of FIG. 3A or FIG. 3B could be used by subsequent gates to compensate for the additional rotation (e.g., the subsequent gate G could be implemented as $GZ_{-(\theta_0+\varphi_0+\omega_0)}$, or the like). In this manner, the disclosed systems and method can be used, together with the method of FIG. 2, to implement sequences of one- and two-qubit gates.

While described for convenience herein with regards to Pauli X gates, the disclosed systems and methods are not so limited. In some embodiments, phase-shifted Pauli Y gates could be used in additional to, or as an alternative to, the phase-shifted Pauli X gates described herein.

Figure 5:
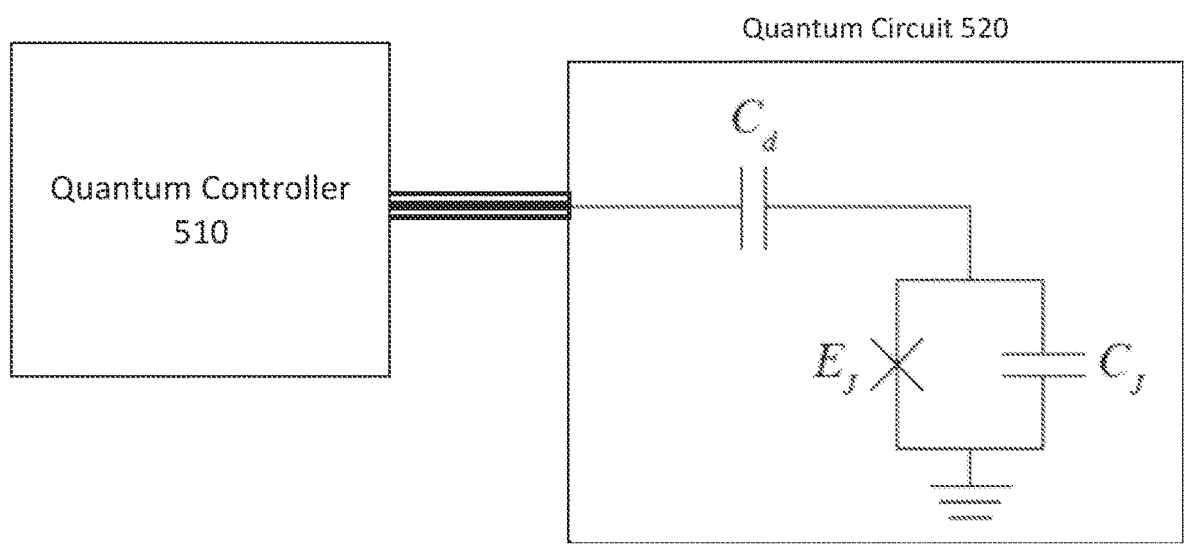
FIG. 5 depicts a quantum controller for applying quantum gates to one or more qubits, in accordance with disclosed embodiments.

FIG. 5 depicts a quantum controller 510 for applying quantum gates to one or more qubits, in accordance with disclosed embodiments. In the non-limiting example depicted in FIG. 5, quantum controller 510 is coupled to a qubit implemented by superconducting quantum circuit 520 using a microwave drive line. In this non-limiting example, the qubit is a transmon qubit and includes capacitor Cd in series with a Josephson junction shunted by a capacitor Cf. However, other types of qubits may be used, such as fluxonium qubits or the like, consistent with disclosed embodiments. In some embodiments, superconducting quantum circuit 520 can be realized using a chip containing the qubit and at least a portion of the microwave drive line coupling the qubit to quantum controller 510.

Quantum controller 510 can be a digital computing device (e.g., a computing device including a central processing unit, graphical processing unit, application specific integrated circuit, field-programmable gate array, or other suitable processor). Quantum controller 510 can configure quantum circuit 520 for computation, provide computational gates, and read state information out of quantum circuit 520.

Consistent with disclosed embodiments, quantum controller 510 can configure the quantum circuit 520 by enabling a gate operation to be performed on one or more qubits of circuit quantum 520. In some embodiments, quantum circuit 520 can be configured by providing one or more bias drives to move two qubits into resonance. Quantum controller 120 can provide the one or more bias drives directly to circuit 520 or can provide instructions to a bias drive source (e.g., waveform generator or the like), causing the bias drive source to provide the bias drives to circuit 520. In some embodiments, providing the bias drive can include passing current through a coil external to circuit 520. In various embodiments, providing the bias drive can include passing current through a coil on the chip. The disclosed embodiments are not limited to a particular method of providing the bias drive or a particular method of biasing the qubits.

Consistent with disclosed embodiments, quantum controller 510 can implement computational gates on circuit 520. In some embodiments, quantum controller 510 can implement such gates by providing one or more PMW pulses (or other gate drives) to qubits in circuit 510. In various embodiments, quantum controller 510 can implement such gates by providing instructions to a computation drive source (e.g., a waveform generator or the like), causing the computational drive source to provide such PMW pulses (or other gate drives) to qubits in circuit 510. The PMW pulses can be selected to implement one or more quantum gates, as described herein. The one or more computational drives can be provided to qubits implemented by quantum circuit 520 using one or more coils coupled to the corresponding qubits. The coils can be external to circuit 520 or on a chip containing circuit 520.

Consistent with disclosed embodiments, quantum controller 510 can be configured to determine state information for quantum circuit 520. In some embodiments, quantum controller 510 can measure a state of one or more qubits of circuit 520. The state can be measured upon completion of a sequence of one or more quantum operations. In some embodiments, quantum controller 510 can provide a probe signal (e.g., a microwave probe tone) to a coupled resonator of circuit 520, or provide instructions to a readout device (e.g., an arbitrary waveform generator) that provides the probe signal. In various embodiments, quantum controller 510 can include, or be configured to receive information from, a detector configured to determine an amplitude and phase of an output signal received from the coupled resonator in response to provision of the microwave probe tone. The amplitude and phase of the output signal can be used to determine the state of the probed qubit(s). The disclosed embodiments are not limited to any particular method of measuring the state of the qubits.

In some embodiments, a non-transitory computer-readable storage medium including instructions is also provided, and the instructions may be executed by a device (such as the disclosed encoder and decoder), for performing the above-described methods. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same. The device may include one or more processors (CPUs), an input/output interface, a network interface, and/or a memory.

The foregoing descriptions have been presented for purposes of illustration. They are not exhaustive and are not limited to precise forms or embodiments disclosed. Modifications and adaptations of the embodiments will be apparent from consideration of the specification and practice of the disclosed embodiments. For example, the described implementations include hardware, but systems and methods consistent with the present disclosure can be implemented with hardware and software. In addition, while certain components have been described as being coupled to one another, such components may be integrated with one another or distributed in any suitable fashion.

Moreover, while illustrative embodiments have been described herein, the scope includes any and all embodiments having equivalent elements, modifications, omissions, combinations (e.g., of aspects across various embodiments), adaptations or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps or inserting or deleting steps.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

It is appreciated that the above-described embodiments can be implemented by hardware, or software (program codes), or a combination of hardware and software. If implemented by software, it may be stored in the above-described computer-readable media. The software, when executed by the processor can perform the disclosed methods. The computing units and other functional units described in this disclosure can be implemented by hardware, or software, or a combination of hardware and software. One of ordinary skill in the art will also understand that multiple ones of the above-described modules/units may be combined as one module/unit, and each of the above-described modules/units may be further divided into a plurality of sub-modules/sub-units.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

The embodiments may further be described using the following clauses:

1. A system for applying a single-qubit quantum gate having a unitary specifiable by at least a first real parameter, a second real parameter, and a third real parameter, the system comprising: a qubit; and a quantum controller coupled to the qubit by a driveline and configured to: apply a sequence of phase-shifted Pauli gates to the qubit to implement the single-qubit quantum gate, each phase-shifted Pauli gate in the sequence having a rotation angle and a phase shift; and wherein the first, second, and third real parameters correspond to: a rotation angle in the sequence and the phase shifts in the sequence; or the phase shifts in the sequence.

2. The system of clause 1, wherein: the quantum controller is further configured to solve a system of linear equations to determine the correspondence between: the first, second, and third real parameters and the rotation angle and two phase shifts in the sequence; or the first, second, and third real parameters and three phase shifts in the sequence.

3. The system of any one of clauses 1 to 2, wherein: the sequence includes two phase-shifted Pauli gates and the first, second, and third real parameters correspond to the rotation angle and two phase shifts in the sequence; or the sequence includes three phase-shifted Pauli gates and the first, second, and third real parameters correspond to three phase shifts in the sequence.

4. The system of any one of clauses 1 to 3, wherein: the first, second, and third real parameters correspond to three phase shifts in the sequence and each of the three phase shifts is a differing function of two of the first, second, and third real parameters.

5. The system of any one of clauses 1 to 4, wherein: the first, second, and third real parameters correspond to three phase shifts in the sequence and the rotation angles in the sequence are selected from the group consisting of $\pi/2$, $-\pi/2$, and $\pi$.

6. The system of clause 1, wherein: all entries on a diagonal of a matrix representing the unitary are zero; the sequence is a single phase-shifted Pauli gate; and wherein the first, second, and third real parameters correspond to a phase shift of the single phase-shifted Pauli gate.

7. The system of clause 6, wherein: the single-qubit quantum gate is selected from the group consisting of $X_{\pi/2}$, $X_{-\pi/2}$, $Y_{\pi/2}$, and $Y_{-\pi/2}$.

8. The system of clause 1, wherein: all entries off a diagonal of a matrix representing the unitary are zero; the sequence is two phase-shifted Pauli gates; the first, second, and third real parameters correspond to phase shifts of the two phase-shifted Pauli gates; and the rotation angle of each of the two phase-shifted Pauli gates is 9. The system of any one of clauses 1 to 8, wherein: the implementation of the single-qubit quantum gate does not introduce an additional rotation.

10. A method for applying a gate sequence of quantum gates to a qubit comprising: implementing a first quantum gate in the gate sequence by applying a first sequence of phase-shifted pulses to the qubit; and after applying the first quantum gate, implementing a second quantum gate in the gate sequence by applying a second sequence of phase-shifted pulses to the qubit, an additional rotation introduced by the implementation of the second quantum gate being independent of the implementation of the first quantum gate, a pulse in the second sequence configured to implement: a virtual Z gate having a first rotation angle; an X gate having a second rotation angle; and the virtual Z gate having a negative of the first rotation angle.

11. The method of clause 10, wherein: the second sequence includes three pulses and the second rotation angle is selected from the group consisting of π/2, −π/2, and π.

12. The method of any one of clauses 10 to 11, further comprising: determining, during application of the gate sequence, an additional Z rotation angle; and the second sequence of phase-shifted pulses is further configured to additionally implement the additional Z rotation angle.

13. The method of clause 10, wherein: the second sequence includes two pulses and the second rotation angle depends on the unitary of the second quantum gate.

14. The method of clause 10, wherein: all entries on a diagonal of a matrix representing the unitary are zero; and the second sequence is a single pulse.

15. The method of clause 10, wherein: all entries off a diagonal of a matrix representing the unitary are zero; and the second sequence is two pulses.

16. The method of any one of clauses 10 to 15, wherein: the additional rotation introduced by the implementation of the second quantum gate is zero.

17. A method for implementing a composition of a two-qubit gate and the tensor product of a first single-qubit gate and a second single-qubit gate, comprising: applying a first sequence of phase-shifted pulses to a first qubit to implement the first single-qubit gate, the implementation of the first single-qubit gate introducing an additional rotation phase shift; applying a second sequence of phase-shifted pulses to a second qubit to implement a product of the additional rotation and the second single-qubit gate; and applying the two-qubit gate to the first qubit and the second qubit to obtain a phase-shifted version of the composition of the two-qubit gate and the tensor product of the first single-qubit gate and the second single-qubit gate.

18. The method of clause 17, wherein: the first sequence is two pulses; and the second sequence is three pulses.

19. The method of clause 18, wherein: each of the two pulses in the first sequence implements a phase-shifted $X_{\pi/2}$ gate or $X_{-\pi/2}$ gate; and one of the three pulses in the second sequence implements a phase-shifted $X_\pi$ gate.

20. The method of clause 17, wherein: the first sequence is two pulses; and the second sequence is two pulses.

21. The method of clause 20, wherein: each of the two pulses in the first sequence implements a phase-shifted $X_{\pi/2}$ gate or $X_{-\pi/2}$ gate; and one of the two pulses in the second sequence implements a phase-shifted X gate having a rotation angle dependent on the second single-qubit gate.

22. The method of any one of clauses 17 to 21, wherein: the two-qubit gate is symmetric phase commuting.

23. A non-transitory computer-readable medium containing instructions that are executable by a processor of a quantum controller coupled to a qubit to cause the quantum controller to perform operations for applying a single-qubit quantum gate to the qubit, the single-qubit quantum gate having a unitary specifiable by a first, a second, and a third real parameter, the operations comprising: applying to the qubit a sequence of phase-shifted Pauli gates, each phase-shifted Pauli gate in the sequence having a rotation angle and a phase shift; and wherein the first, second, and third real parameters correspond to: a rotation angle and the phase shifts in the sequence; or the phase shifts in the sequence.

24. The non-transitory computer-readable medium of clause 23, wherein: the first, second, and third real parameters correspond to three phase shifts in the sequence and each of the three phase shifts is a differing function of two of the first, second, and third real parameters.

25. The non-transitory computer-readable medium of clause 23, wherein: the sequence includes two phase-shifted Pauli gates and the first, second, and third real parameters correspond to the rotation angle and two phase shifts in the sequence; or the sequence includes three phase-shifted Pauli gates and the first, second, and third real parameters correspond to three phase shifts in the sequence.

26. The non-transitory computer-readable medium of clause 23, wherein: all entries on a diagonal of a matrix representing the unitary are zero; the sequence is a single phase-shifted Pauli gate; and wherein the first, second, and third real parameters correspond to a phase shift of the single phase-shifted Pauli gate.

27. The non-transitory computer-readable medium of clause 23, wherein: all entries off a diagonal of a matrix representing the unitary are zero; the sequence is two phase-shifted Pauli gates; the first, second, and third real parameters correspond to phase shifts of the two phase-shifted Pauli gates; and a rotation angle of each of the two phase-shifted Pauli gates is 7 1

In the drawings and specification, there have been disclosed exemplary embodiments. However, many variations and modifications can be made to these embodiments. Accordingly, although specific terms are employed, they are used in a generic and descriptive sense only and not for purposes of limitation or restriction of the scope of the embodiments, the scope being defined by the following claims.

What is claimed is:

1. A system for applying a single-qubit quantum gate having a unitary specifiable by at least a first real parameter, a second real parameter, and a third real parameter, the system comprising:
   a qubit; and
   a quantum controller coupled to the qubit by a driveline and configured to:
      apply a sequence of phase-shifted Pauli gates to the qubit to implement the single-qubit quantum gate, each phase-shifted Pauli gate in the sequence having a rotation angle and a phase shift; and
      wherein the first, second, and third real parameters correspond to:
         a rotation angle in the sequence and the phase shifts in the sequence; or
         the phase shifts in the sequence.

2. The system of claim 1, wherein:
the quantum controller is further configured to solve a system of linear equations to determine the correspondence between:
   the first, second, and third real parameters and the rotation angle and two phase shifts in the sequence; or
   the first, second, and third real parameters and three phase shifts in the sequence.

3. The system of claim 1, wherein:
the first, second, and third real parameters correspond to three phase shifts in the sequence and each of the three phase shifts is a differing function of two of the first, second, and third real parameters.

4. The system of claim 1, wherein:
the first, second, and third real parameters correspond to three phase shifts in the sequence and the rotation angles in the sequence are selected from the group consisting of π/2, −π/2, and π.

5. The system of claim 1, wherein:
the implementation of the single-qubit quantum gate does not introduce an additional rotation.

6. The system of claim 1, wherein:
the sequence includes two phase-shifted Pauli gates and the first, second, and third real parameters correspond to the rotation angle and two phase shifts in the sequence; or
the sequence includes three phase-shifted Pauli gates and the first, second, and third real parameters correspond to three phase shifts in the sequence.

7. The system of claim 1, wherein:
all entries on a diagonal of a matrix representing the unitary are zero;
the sequence is a single phase-shifted Pauli gate; and
wherein the first, second, and third real parameters correspond to a phase shift of the single phase-shifted Pauli gate.

8. The system of claim 7, wherein:
the single-qubit quantum gate is selected from the group consisting of $X_{\pi/2}$, $X_{-\pi/2}$, $Y_{\pi/2}$, and $Y_{-\pi/2}$.

9. The system of claim 1, wherein:
all entries off a diagonal of a matrix representing the unitary are zero;
the sequence is two phase-shifted Pauli gates;
the first, second, and third real parameters correspond to phase shifts of the two phase-shifted Pauli gates; and
the rotation angle of each of the two phase-shifted Pauli gates is $\pi$.

10. A method for applying a gate sequence of quantum gates to a qubit comprising:
implementing a first quantum gate in the gate sequence by applying a first sequence of phase-shifted pulses to the qubit; and
after applying the first quantum gate, implementing a second quantum gate in the gate sequence by applying a second sequence of phase-shifted pulses to the qubit, an additional rotation introduced by the implementation of the second quantum gate being independent of the implementation of the first quantum gate, a pulse in the second sequence configured to implement:
a virtual Z gate having a first rotation angle;
an X gate having a second rotation angle; and
the virtual Z gate having a negative of the first rotation angle.

11. The method of claim 10, wherein:
the additional rotation introduced by the implementation of the second quantum gate is zero.

12. The method of claim 10, wherein:
the second sequence includes three pulses and the second rotation angle is selected from the group consisting of $\pi/2$, $-\pi/2$, and $\pi$.

13. The method of claim 10, wherein:
the second sequence includes two pulses and the second rotation angle depends on the unitary of the second quantum gate.

14. The method of claim 10, wherein:
all entries on a diagonal of a matrix representing the unitary are zero; and
the second sequence is a single pulse.

15. The method of claim 10, wherein:
all entries off a diagonal of a matrix representing the unitary are zero; and
the second sequence is two pulses.

16. The method of claim 10, further comprising:
determining, during application of the gate sequence, an additional Z rotation angle; and
the second sequence of phase-shifted pulses is further configured to additionally implement the additional Z rotation angle.

17. A method for implementing a composition of a two-qubit gate and the tensor product of a first single-qubit gate and a second single-qubit gate, comprising:
applying a first sequence of phase-shifted pulses to a first qubit to implement the first single-qubit gate, the implementation of the first single-qubit gate introducing an additional rotation phase shift;
applying a second sequence of phase-shifted pulses to a second qubit to implement a product of the additional rotation and the second single-qubit gate; and
applying the two-qubit gate to the first qubit and the second qubit to obtain a phase-shifted version of the composition of the two-qubit gate and the tensor product of the first single-qubit gate and the second single-qubit gate.

18. The method of claim 17, wherein:
the first sequence is two pulses; and
the second sequence is three pulses.

19. The method of claim 18, wherein:
each of the two pulses in the first sequence implements a phase-shifted $X_{\pi/2}$ gate or $X_{-\pi/2}$ gate; and
one of the three pulses in the second sequence implements a phase-shifted $X_\pi$ gate.

20. The method of claim 17, wherein:
the first sequence is two pulses; and
the second sequence is two pulses.

21. The method of claim 20, wherein:
each of the two pulses in the first sequence implements a phase-shifted $X_{\pi/2}$ gate or $X_{-\pi/2}$ gate; and
one of the two pulses in the second sequence implements a phase-shifted X gate having a rotation angle dependent on the second single-qubit gate.

22. The method of claim 17, wherein:
the two-qubit gate is symmetric phase commuting.

23. A non-transitory computer-readable medium containing instructions that are executable by a processor of a quantum controller coupled to a qubit to cause the quantum controller to perform operations for applying a single-qubit quantum gate to the qubit, the single-qubit quantum gate having a unitary specifiable by a first, a second, and a third real parameter, the operations comprising:
applying to the qubit a sequence of phase-shifted Pauli gates, each phase-shifted Pauli gate in the sequence having a rotation angle and a phase shift; and
wherein the first, second, and third real parameters correspond to:
a rotation angle and the phase shifts in the sequence; or
the phase shifts in the sequence.

* * * * *